FINE TUNER

Filed June 21, 1962

INVENTORS:
John Y. Ma
John J. Kornacker
By Hofgren, Brady, Wegner
Allen & Stellman
Attys.

FINE TUNER

Filed June 21, 1962 2 Sheets-Sheet 2

United States Patent Office 3,244,012
Patented Apr. 5, 1966

3,244,012
FINE TUNER
John Y. Ma, Algonquin, and John J. Kornacker, Niles, Ill., assignors to Oak Manufacturing Company, a corporation of Delaware
Filed June 21, 1962, Ser. No. 204,182
10 Claims. (Cl. 74—10.8)

This invention relates to a control device, and more particularly to a channel selector and fine tuner especially suited for use in television sets.

The primary object of this invention is to provide a new and improved control device.

Another object is provision of a new and improved channel selector and fine tuning device for television sets or the like.

An important object is provision of a new and improved channel selector and fine tuning device which is convenient to use and economical to manufacture.

A more specific object is provision of a television channel selector and fine tuning device having a chassis, a channel selector shaft rotatably mounted on the chassis for selecting any one of a plurality of channels, a plurality of fine tuning adjusting screws threadedly mounted concentric about the channel selector shaft for rotation therewith and each having a gear head, one screw corresponding to each channel for fine tuning of the respective channel, a fine tuning shaft carrying a driving gear mating with gearing on a link for operating the gear head of the screw corresponding to the selected channel, the link being mounted for movement into and out of a fine tuning position with the gearing mating with a gear head of the channel selected when the link is in fine tuning position and free of the gear head when the link is out of fine tuning position, the link being moved to fine tuning position responsive to operation of the fine tuning shaft.

Other objects and advantages to the invention will become readily apparent from the following detailed description taken in connection with the accompanying drawings, in which.

Figure 1:
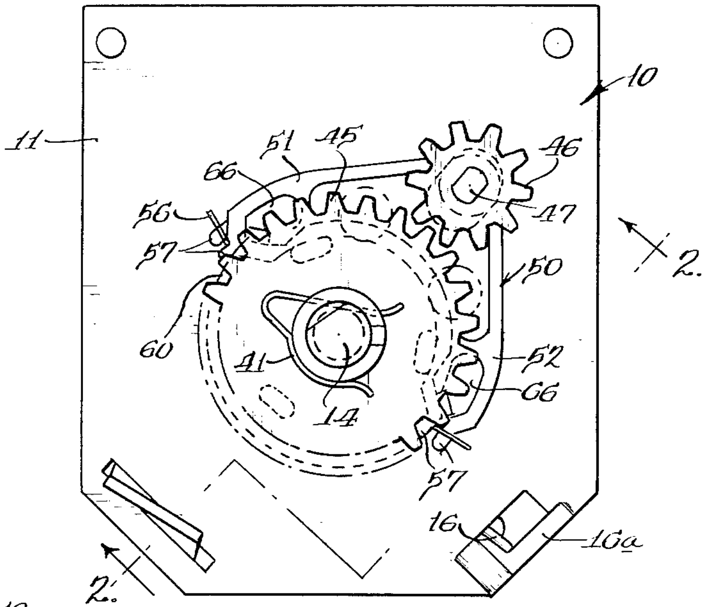
FIGURE 1 is a front elevational view of a preferred embodiment of the invention in the form of a channel selector and fine tuning device for television sets.
Figure 2:
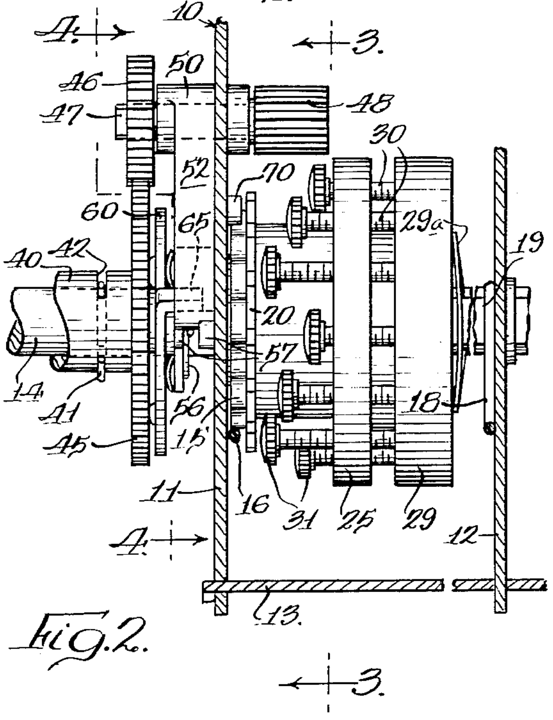
FIGURE 2 is a fragmentary sectional view taken generally along the line 2—2 of FIGURE 1.

While an illustrative embodiment of the invention is shown in the drawings and will be described in detail herein, the invention is susceptible to embodiment in many different forms, and it should be understood that the present disclosure is to be considered as an exemplification of the principles of the invention and it is not intended to limit the invention to the embodiment illustrated. The scope of the invention will be pointed out in the appended claims.

The invention is, in brief, directed to a control device illustrated in the form of a channel selector and fine tuning control device particularly suited for use in television sets. Upon operating a channel selector shaft for selecting a desired channel, a fine tuning mechanism for the channel selected is automatically positioned for fine tuning which is effected responsive to operation of a fine tuning shaft. Responsive to rotation of the fine tuning shaft in either direction, a drive train is operatively engaged for fine tuning of the channel selected. Upon releasing the fine tuning shaft, the drive train is disengaged so that the fine tuning adjustment for the particular channel is not altered as other channels are selected. Convenience and accuracy of fine tuning operation along with principles of construction which provide for a relatively low cost device are important features of this invention.

Referring to the drawings, a combined television channel selector and fine tuning device includes a chassis 10 on which is mounted channel selector mechanism and fine tuning mechanism. In the illustrated embodiment, chassis 10 has a generally vertical front wall 11 and parallel thereto another wall 12, these walls being rigidly connected in any suitable manner as by a bottom wall 13. The channel selector mechanism includes channel selector shaft 14 journaled in walls 11 and 12, with a front end portion of the shaft extending outwardly from front wall 11 and adapted to receive a suitable knob (not shown) for rotating the shaft in either direction and operating channel selector components (not shown) connected with a rear portion of the shaft in any suitable manner. These components may be mounted on chassis 10 if desired.

Shaft 14 is held against axial movement in chassis 10, and herein an index disc 15 is fixedly mounted on shaft 14 immediately inwardly of chassis front wall 11, thus holding shaft 14 against movement forwardly of the chassis. A generally U-shaped torsion spring 16 is suitably mounted on chassis 10 as by brackets 16*a*. This spring has a detent portion 17 on one leg selectively received in any one of a plurality of circumferentially disposed notches in index plate 15 so that channel selector shaft 14 may be rotated step by step in predetermined manner, each step preferably corresponding to the setting for one of the channels. The free end of the other leg of spring 16 has a generally hook-shaped portion 18 received in a circumferential groove 19 in shaft 14 immediately inwardly of wall 12, thus holding shaft 14 against axial movement rearwardly of chassis 10 and retaining spring 16 stressed and detent 17 resiliently urged into one of the index plate notches. In order to retain detent 17 in these notches, a plate 20 is secured on shaft 14 against index plate 15 and extends outwardly from the periphery of the index plate to define with front wall 11 a channel for retaining detent 17. The end 18 of torsion spring 16 which contacts the switch shaft groove 19 at the shield 12 also serves as an electrical ground.

Figure 7:
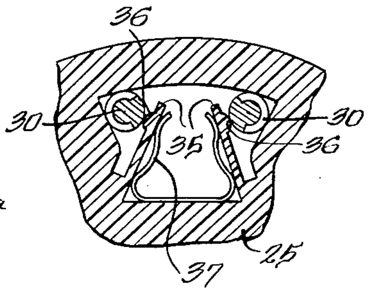
FIGURE 7 is an enlarged fragmentary sectional view taken generally along the line 7—7 of FIGURE 5.

The fine tuning mechanism includes a rotor support 25 mounted on shaft 14 for rotation therewith by provision of bosses 26 extending forwardly from the body of this support and closely received in aligned holes in index plate 15 and in plate 20. Rotor support 25 has a splined portion 27 telescopically receiving splines 28 in a sleeve portion of a rotor 29 and mounting the rotor for rotation with shaft 14. Rotor 29 may be held against axial movement rearwardly on shaft 14 in any suitable manner as by a suitable spring clip 29*a* held on shaft 14 and seated against the rotor. This rotor is provided for suitably mounting fine tuning components such as inductors or capacitors, one for each of the channels, and each having adjusting means operable responsive to axial movement of adjusting members, here in the form of screws 30 threadedly mounted in rotor support 25 for movement in a direction generally parallel to the axis of shaft 14. Each adjusting screw 30 has a gear head 31 for rotating the respective screw and threading it back and forth in support 25. Support 25 is preferably formed of a suitable plastic material and the threaded connection between screws 30 and support 25 is provided, as may best be seen in FIGURE 7, by fingers 35 extending outwardly from the body of the support and each having a smooth surface lug 36, of nylon or the like, threadedly seated against the respective screw thread. Adjacent lugs are resiliently urged against threads of their screws 30 by a generally U-shaped flat spring 37 having opposed legs engaging an adjacent finger 35. Thus, at the end of screw travel the screw may continue to be rotated without stripping any threads. Upon rearward movement of any screw its gear head 31 will abut the support 25 and upon forward movement its gear head will abut plate 20, thus preventing removal of adjusting screws 30 when the device is operatively assembled.

The fine tuning mechanism further includes a fine tuning shaft 40 telescoped on channel selector shaft 14 for rotation independently of the channel selector shaft and held against axial movement with respect to the channel selector shaft by a suitable generally U-shaped clip 41 having one leg extending through a slot 42 in fine tuning shaft 40 and seated in a circumferential groove 43 in channel selector shaft 14. Fine tuning shaft 40 has an outer end adapted to receive a control knob (not shown) for rotating this shaft. A drive member, here in the form of a drive gear 45, is fixedly mounted on fine tuning shaft 40 for rotation therewith. After a channel has been selected by rotation of channel selector shaft 14, the fine tuning shaft 40 may be rotated for operating an adjusting unit. More particularly, drive gear 45 drives a driven member of this unit in the form of a driven gear or pinion 46 fixedly mounted on one end of a gear shaft 47 which is integral with another driven member in the form of an elongated driven gear 48 which meshes with the gear head 31 of the adjusting screw 30 corresponding to the selected channel.

Figure 3:
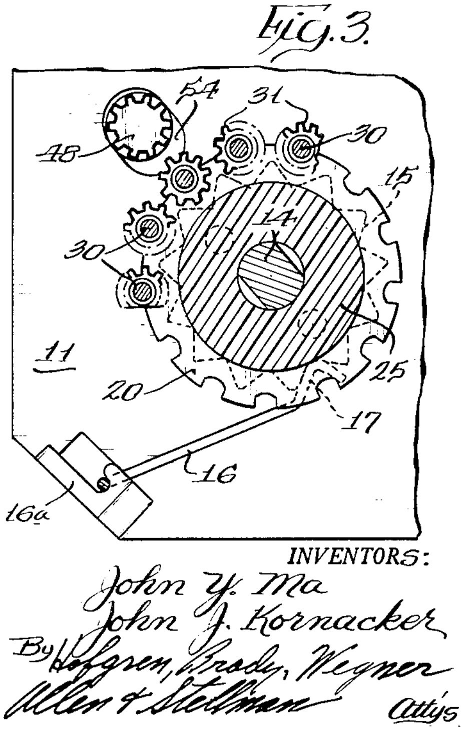
FIGURE 3 is a fragmentary sectional view taken generally along the line 3—3 of FIGURE 2.
Figure 4:
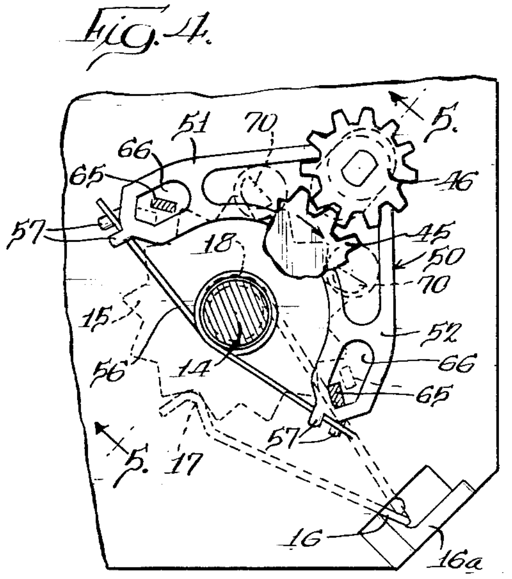
FIGURE 4 is a fragmentary sectional view taken generally along the line 4—4 of FIGURE 2.
Figure 5:
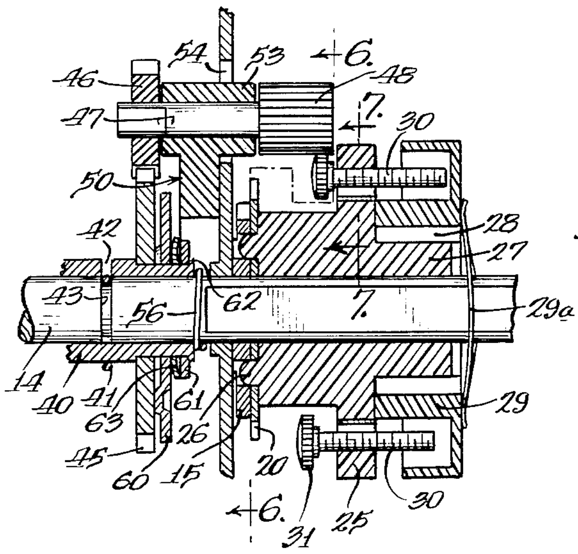
FIGURE 5 is a fragmentary sectional view taken generally along the line 5—5 of FIGURE 4.

In order to engage and disengage driven gear 48 from gear head 31, gear shaft 47 is journaled in an adjusting unit drive link 50 mounted for movement into and out of fine tuning position, with driven gear 48 engaging a gear head 31 in fine tuning position and out of engagement with the gear heads when driving link 50 is out of fine tuning position. The teeth on gears and gear head are shaped so that the gear head is not moved during disengagement. More particularly, fine tuning link 50 is bifurcated, as may best be seen in FIGURE 4, with opposed legs 51 and 52 straddling channel selector shaft 40 and connected by a journal portion 53, the gear shaft 47 being journaled into the journal portion for rotation about an axis generally parallel to the shaft axes. Journal portion 53 is slidably received in a slot 54 in front plate 11, as may best be seen in FIGURES 3 and 5. Slot 54 extends generally radially of shaft 14 in the illustrated embodiment. Thus, drive link 50 may move radially of shaft 14 into and out of fine tuning position. As may best be seen in FIGURE 4, a wire spring 56 is telescoped on shaft 14 and has opposed legs seated between fingers 57 on outer free ends of legs 51 and 52, thus providing means urging drive link 50 out of fine tuning position and driven gear 48 away from adjusting screw gear head 31.

Means is provided for moving drive link 50 into fine tuning position responsive to rotation to fine tuning shaft 40, and herein these means is in the form of a drive plate 60 telescoped on fine tuning shaft 40 between driving gear 45 and chassis front plate 11. A friction type sliding clutch, including a washer 61, mounted on the inner end of fine tuning shaft 40 and held against axial movement inwardly of the shaft in any suitable manner as by a outwardly rolled portion 62 of the shaft, presses a spring washer 63 against the inner face of drive plate 60 so that this drive plate may rotate in either direction with fine tuning shaft 40. Outwardly extending fingers 65 of drive plate 60 are received in slots 66 in the outer ends of drive link legs 51 and 52, and upon rotation of fine tuning shaft 40 the drive plate rotates with this shaft until one of the fingers 65 has engaged the base of its slot 66 and moved drive link 50 radially inwardly toward shaft 14, thus moving the drive link to fine tuning position with driven gear 48 engaged with the selected one of the adjusting screw gear heads 31 corresponding to the channel selected. It should be noted that spring 56 resists such inward movement of drive link 50 and holds this link so that the link effectively moves in a radial direction toward fine tuning shaft 40. When the knob on fine tuning shaft 40 is released, spring 56 moves drive link 50 out of fine tuning position, and this also occurs in the event that the direction of rotation of the fine tuning shaft 40 is reversed.

Thus, after the desired channel has been selected, should fine tuning be required, it is merely necessary to rotate the fine tuning shaft in the direction indicated by the desired adjustment, and once the desired tuning has been obtained for any particular channel, such tuning will not be disturbed as other channels are selected, so that when the original channel is again selected, the fine tuning adjustment is still in its previously adjusted position, but may be easily changed if required.

Figure 6:
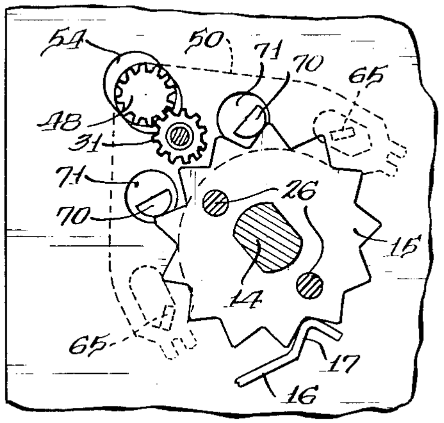
FIGURE 6 is a fragmentary sectional view taken generally along the line 6—6 of FIGURE 5.

Extending inwardly from the body of driving link 50 is a pair of lugs 70, as may best be seen in FIGURE 6. These lugs extend through openings 71 in front plate 11. Should fine tuning shaft 40 tend to bind and rotate with channel selector shaft 14 as shaft 14 is rotated to select a channel, one of the lugs (depending on the direction of rotation of shaft 14) moves inwardly and against the notched periphery of index plate 15 to effectively prevent meshing of gear head 31 and gear 48 so that fine tuning setting is not inadvertently altered.

To summarize the operation of the control device, the channel selector shaft 14 is rotated to select any one of a number of channels. Rotation of this shaft rotates fine tuning rotor support 25 and rotor 29 so that a gear head 31 of the adjusting screw corresponding to the channel selected is in position to be engaged by driven gear 48 of the fine tuning mechanism. If, through prior fine tuning adjustment, the selected channel is satisfactorily tuned, the fine tuning mechanism need not be operated. However, should fine tuning adjustment be desired, it is merely necessary to rotate fine tuning shaft 40 in either direction, corresponding to the adjustment desired. Upon rotation of fine tuning shaft 40, drive plate 60 rotates with this shaft because of the friction type slip clutch 61, 63 operatively connecting the drive plate 60 with fine tuning shaft 40, until a drive plate finger 65 has moved drive link 50 inwardly to mesh driven gear 48 with gear head 31 of the adjusting screw 30 corresponding to the channel selected. Continued rotation of fine tuning shaft 40 in the same direction drives driven gear 48 through driven gear 46 and drive gear 45, thus rotating the adjusting screw 30 and moving it axially inwardly or outwardly depending upon the direction of rotation of the fine tuning shaft 40. Upon releasing fine tuning shaft 40, or reversing its direction of rotation, drive link 50 is moved out of fine tuning position by spring 56, and if the direction of rotation of the fine tuning shaft 40 has been reversed, the other drive plate finger 65 will move drive link 50 inwardly to fine tuning position and again mesh driven gear 48 with gear head 31.

We claim:

1. In a television channel selecting and fine tuning device a chassis, a channel selector shaft rotatably mounted on said chassis for operation to various selected channel positions, a support mounted on said selector shaft for rotation therewith, fine tuning adjusting screws concentric about said selector shaft and threadedly mounted on said support, one screw corresponding to each said channel position and each screw having a gear head, a fine tuning shaft telescoped on said selector shaft and rotatable independently of said selector shaft, a driving gear mounted on said fine tuning shaft for rotation therewith, an adjusting unit having a bifurcated link with opposed legs straddling said selector shaft, said legs having free end portions with slots on opposite sides of said selector shaft, a journal portion connecting said legs, first and second gears mounted on a common gear shaft for rotation together, said gear shaft being journaled in said journal portion, means slidably mounting said journal portion in a slot in said chassis for movement radially of said selector shaft into and out of fine tuning position and said first gear meshed with the gear head corresponding to the channel selected and said second gear meshed with said driving gear in fine tuning position, and said first gear disengaged from the last said gear head when said link is out of fine tuning position, a spring mounted on said selector shaft and having opposite portions engaging the end portions of said legs and urging said link out of fine tuning position, a member mounted on said fine tuning shaft, a slip clutch connection between said member and said fine tuning shaft for rotation of said member with said fine tuning shaft, a pair of fingers extending from said member on opposite sides of said selector shaft, one finger received in each of said leg slots, one of said fingers moving said link to fine tuning position responsive to rotation of said fine tuning shaft in one direction and the other of said fingers moving said link to fine tuning position responsive to rotation of said fine tuning shaft in the opposite direction.

2. In a television channel selecting and fine tuning device, a chassis, a channel selector shaft rotatably mounted on said chassis for selecting various channels, a support mounted on said selector shaft for rotation therewith, fine tuning adjusting screws concentric about said selector shaft and threadedly mounted on said support, one screw corresponding to each channel and each screw having a gear head, a fine tuning shaft telescopically mounted on said channel selector shaft for rotation relative thereto, a driving gear mounted on said fine tuning shaft for rotation therewith, and adjusting unit having a link, gear means rotatably mounted on said link for engagement with said driving gear and the gear head corresponding to the selected channel, means mounting said link on said chassis for generally planar movement transversely of said fine tuning shaft into and out of fine tuning position with said gear means meshed with said driving gear and the gear head corresponding to the channel selected in fine tuning position, and disengaged from the last said gear head when said link is out of fine tuning position, the rotational axis of said gear means being parallel to the axis of the fine tuning shaft when said link is in and out of said fine tuning position, and means moving said link to fine tuning position responsive to rotation of said fine tuning shaft.

3. The device of claim 2, and means for effectively preventing operation of said adjusting screws should said fine tuning shaft rotate responsive to rotation of said channel selector shaft.

4. The device of claim 2, and means comprising a portion secured on said selector shaft having a notched periphery about said shaft, and a detent on said chassis selectively and releasably held in a notch for indexing rotation of said selector shaft, and lug means on said link for releasably engaging said notched periphery and effectively prevent engagement of said gear means and the gear head corresponding to the selector shaft position and fine tuning disruption should said fine tuning shaft rotate responsive to rotation of said selector shaft.

5. The device of claim 2, wherein the threaded mountings of the adjusting screws each comprises means for rotation of the respective screw free of threaded engagement with said support at the end of normal screw travel.

6. In a television channel selecting and fine tuning device, a chassis, a channel selector shaft rotatably mounted on said chassis and mounting a support for rotation with said selector shaft, fine tuning adjusting means threadedly mounted on said support and each having a head, a fine tuning shaft telescopically mounted on said channel selector shaft for rotation relative thereto, driving means operably responsive to rotation of said fine tuning shaft and including a link mounted on said chassis for generally planar movement transversely of said fine tuning shaft into and out of fine tuning position, said means further including a driving element rotatably mounted on said link with the axis of rotation parallel to the rotational axis of said fine tuning shaft when said link is in and out of fine tuning position, said driving element operably engaging the head member corresponding to the channel selected in fine tuning position and disengaged from the last said head member when said link is out of fine tuning position, means urging said link out of fine tuning position, and means moving said link to fine tuning position responsive to rotation of said fine tuning shaft.

7. In a television channel selecting and fine tuning device, a chassis, a channel selector shaft rotatably mounted on said chassis for selecting any one of a plurality of channels, a support mounted on said selector shaft for rotation therewith, fine tuning adjusting screws threadedly mounted on said support and each having a gear head, one screw corresponding to each channel for fine tuning of the respective channel responsive to rotation of the corresponding screw, a fine tuning shaft telescoped on said selector shaft and rotatable independently of said selector shaft, a driving gear mounted on said tuning shaft for rotation therewith, a driving unit having first and second gears connected for rotation together and journaled on a link, means mounting said link on said chassis for generally planar movement transversely of said fine tuning shaft into and out of fine tuning position with said first gear meshed with the gear head of the screw corresponding to the channel selected and said second gear meshed with said driving gear in fine tuning position, whereby rotation of said fine tuning shaft causes rotation of the last said screw, and said first gear disengaged from the last said gear head when link is out of fine tuning position, the rotational axis of said first and second gears being parallel to the rotational axis of the fine tuning shaft when said link is in and out of fine tuning position, means urging said link out of fine tuning position, and means moving said link to fine tuning position responsive to rotation of said fine tuning shaft in either direction.

8. In a television channel selecting and fine tuning device, a chassis, a channel selector shaft rotatably mounted on said chassis for selecting various channels, a support mounted on said selector shaft for rotation therewith, fine tuning adjusting screws concentric about said selector shaft and threadedly mounted on said support, one screw corresponding to each channel and each screw having a gear head, a lug for each adjusting screw, resilient means releasably seating each lug in the thread of its respective adjusting screw for rotation of the screw free of threaded engagement with said support at the end of normal screw travel, a fine tuning shaft mounted on said chassis, a driving gear mounted on said fine tuning shaft for rotation therewith, an adjusting unit having a link, gear means rotatably mounted on said link for engagement with said driving gear and the gear head corresponding to the selected channel, said link being mounted on said chassis for movement into and out of fine tuning position with said gear means meshed with said driving gear and the gear head corresponding to the channel selected in fine tuning position, and disengaged from the last said gear head when said link is out of fine tuning position, and means moving said link to fine tuning position responsive to rotation of said fine tuning shaft.

9. In a television tuner, a chassis, a support rotatably mounted on said chassis and carrying a plurality of individually adjustable members corresponding to different television channels, a rotary fine tuning shaft mounted coaxially with said support, a carrier member, means on said chassis mounting said carrier member for planar movement transversely of said fine tuning shaft into and out of a fine tuning position, a driving member on said fine tuning shaft, a driven member rotatably mounted on said carrier member and adapted to be rotated by said driving member to move said carrier member into and out of fine tuning position, drive means rotatably mounted on said carrier member for rotation about an axis parallel to the axis of said fine tuning shaft and adapted to engage a selected one of said individually adjustable members only when said carrier member is in said fine tuning position, said drive means being out of engagement with said individually adjustable members when said carrier member is out of said fine tuning position, thereby to permit rotation of said support without engagement of said drive means with individually adjustable members.

10. In a television channel selecting and fine tuning device, a channel selector means for selecting various channels, fine tuning adjusting means including operating parts, one for each channel, means operatively positioning said parts responsive to operation of said channel selector means, a rotary fine tuning shaft mounted coaxially with said channel selector means, a carrier member mounted for generally planar movement transversely of said fine tuning shaft into and out of a fine tuning position, cooperating means on said fine tuning shaft and said carrier member for moving said carrier member in response to rotation of said fine tuning shaft, and driving means on said carrier member movable therewith into and out of fine tuning position responsive to rotation of said fine tuning shaft and operably engaging said part corresponding to the channel selected in fine tuning position and disengaged from the last said part when out of fine tuning position.

References Cited by the Examiner

UNITED STATES PATENTS

| | | | |
|---|---|---|---|
| 3,022,674 | 2/1962 | Cross et al. | 74—10.6 X |
| 3,058,075 | 10/1962 | Polley | 74—10.6 |
| 3,065,642 | 11/1962 | Capelle et al. | 74—10.8 X |

BROUGHTON C. DURHAM, *Primary Examiner.*

T. W. SHEAR, *Assistant Examiner.*